United States Patent [19]
Kishii et al.

[11] Patent Number: 5,877,089
[45] Date of Patent: Mar. 2, 1999

[54] SLURRY CONTAINING MANGANESE OXIDE

[75] Inventors: Sadahiro Kishii; Akiyoshi Hatada; Rintaro Suzuki; Hiroshi Horie; Yoshihiro Arimoto; Ko Nakamura, all of Kawasaki, Japan

[73] Assignee: Fujitsu Limited, Kanagawa, Japan

[21] Appl. No.: 14,246

[22] Filed: Jan. 27, 1998

Related U.S. Application Data

[62] Division of Ser. No. 674,507, Jul. 2, 1996, Pat. No. 5,763,325.

[30] Foreign Application Priority Data

| Jul. 4, 1995 | [JP] | Japan | 7-169048 |
| Sep. 1, 1995 | [JP] | Japan | 7-224955 |
| Jan. 5, 1996 | [JP] | Japan | 8-000220 |

[51] Int. Cl.$^6$ .................................................. H01L 21/463
[52] U.S. Cl. ............................. 438/693; 51/306; 51/307; 51/309; 252/79.1; 106/11
[58] Field of Search ............................. 51/306, 307, 309; 252/79.1; 106/11; 438/693

[56] References Cited

U.S. PATENT DOCUMENTS

| 5,228,886 | 7/1993 | Zipperian . |
| 5,244,534 | 9/1993 | Yu et al. . |
| 5,308,438 | 5/1994 | Cote et al. . |
| 5,312,512 | 5/1994 | Allman et al. . |
| 5,395,801 | 3/1995 | Doan et al. . |
| 5,445,996 | 8/1995 | Kodera et al. . |
| 5,498,565 | 3/1996 | Gocho et al. . |
| 5,593,919 | 1/1997 | Lee et al. . |
| 5,763,325 | 6/1998 | Kishii et al. ............................. 438/693 |

*Primary Examiner*—Deborah Jones
*Attorney, Agent, or Firm*—Armstrong, Westerman, Hattori, McLeland Naughton

[57] ABSTRACT

A slurry contains $MnO_2$ or other manganese oxide as a primary component of abrasive particles. Further, a polishing process using such a manganese oxide abrasive and a fabrication process of a semiconductor device using such a polishing process are disclosed.

5 Claims, 20 Drawing Sheets

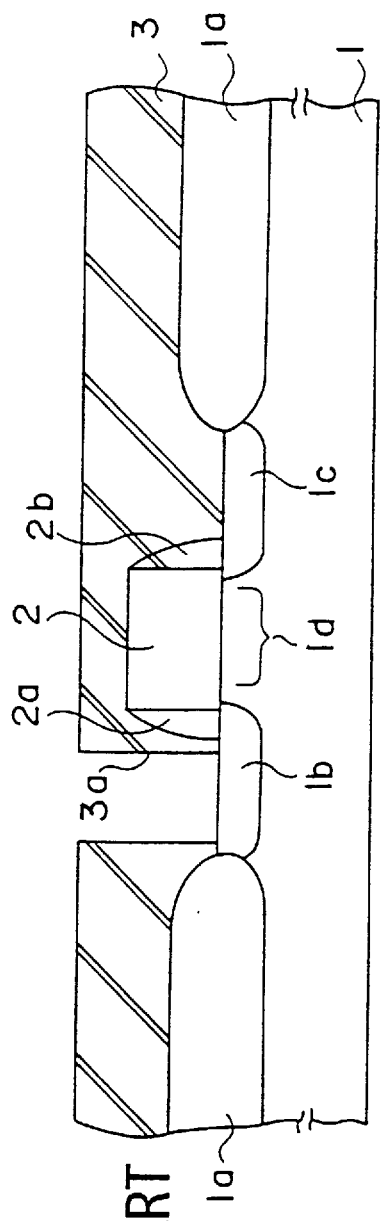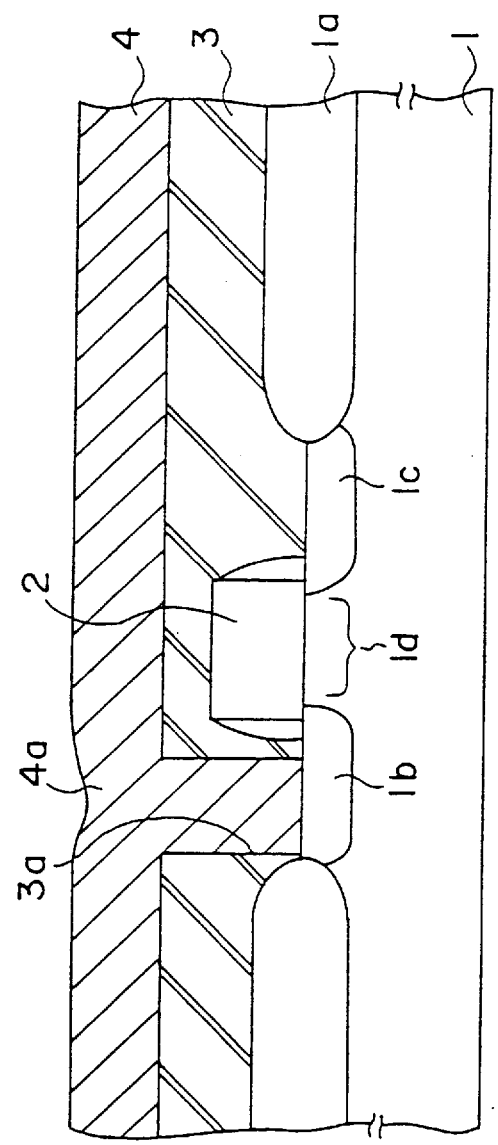
FIG. 1C PRIOR ART
FIG. 1D PRIOR ART

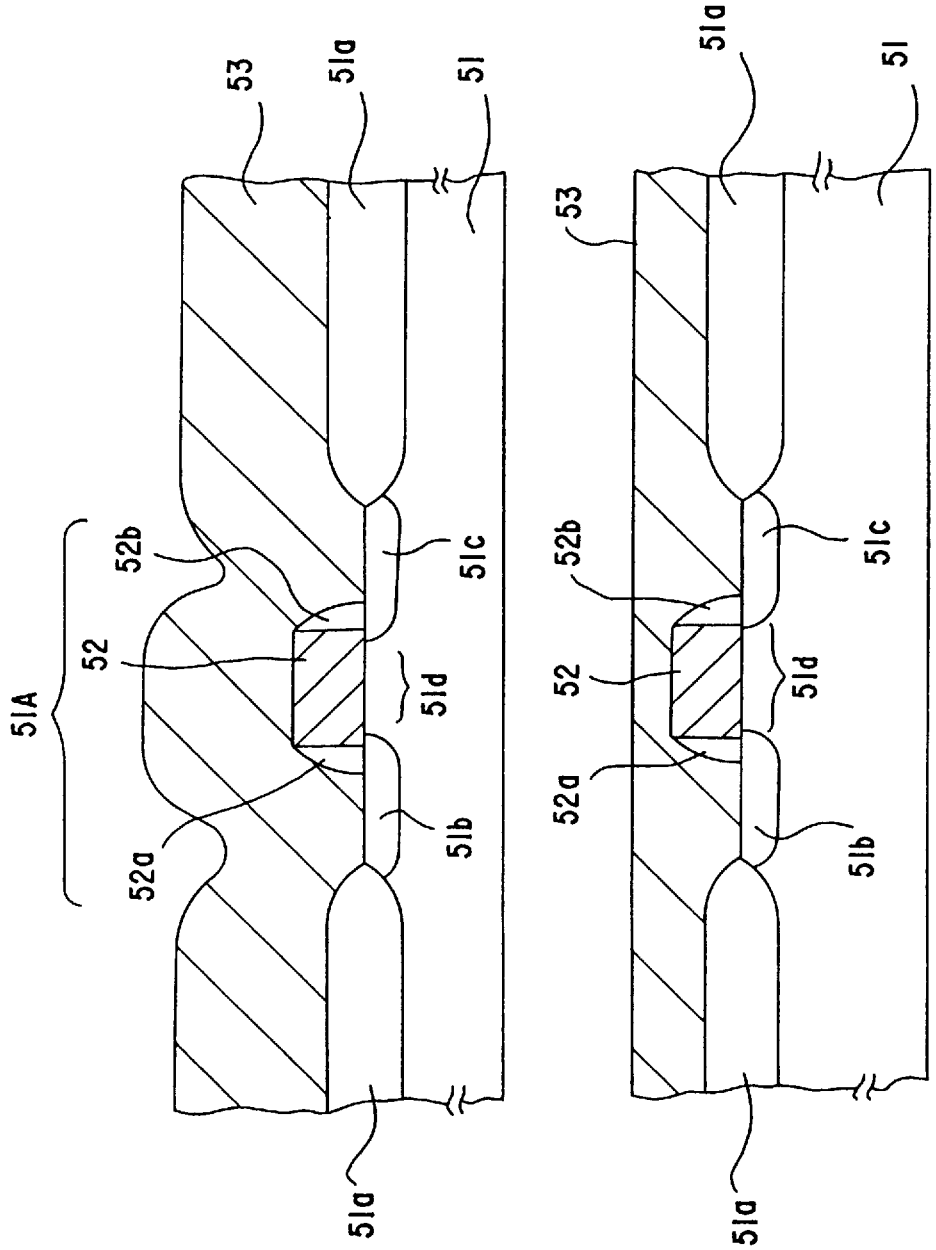

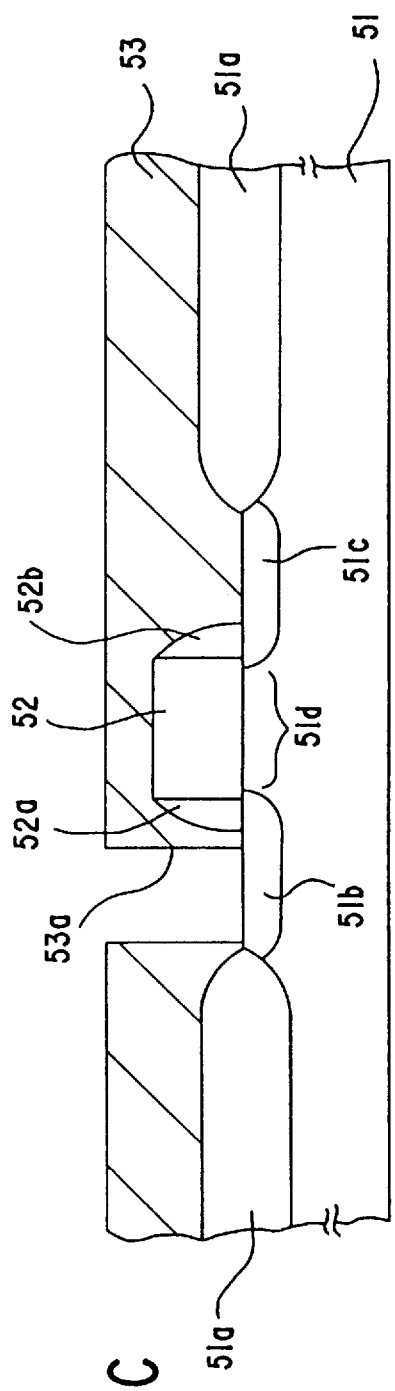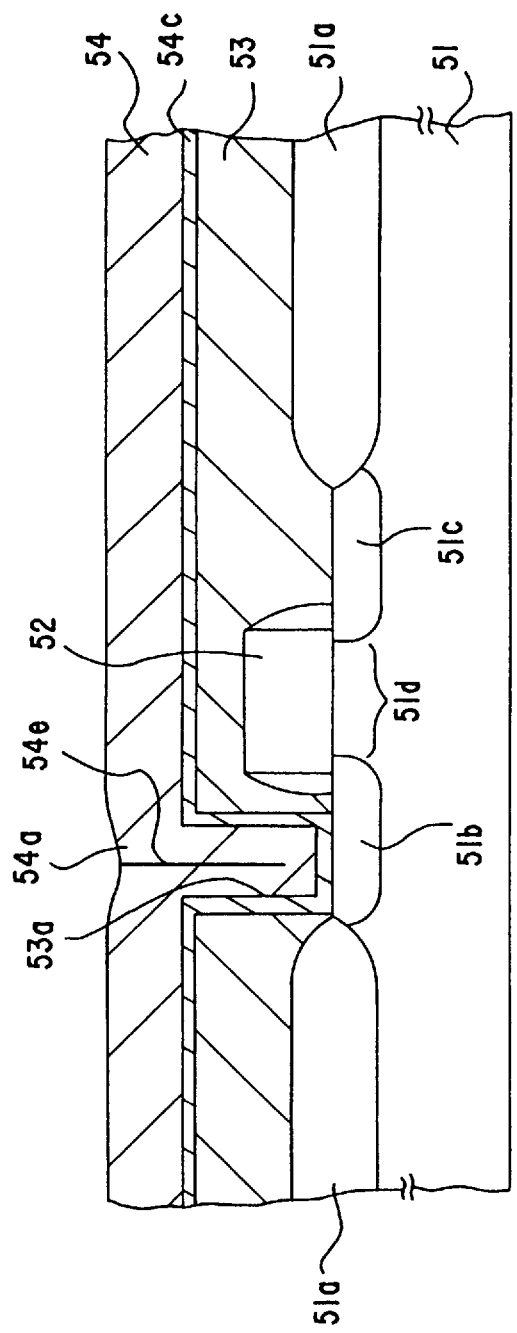
FIG.11C
FIG.11D

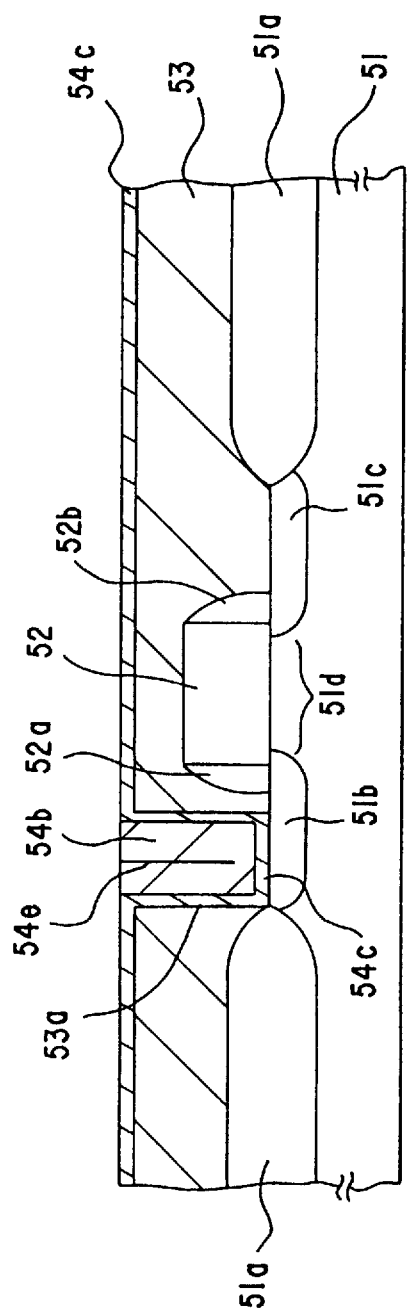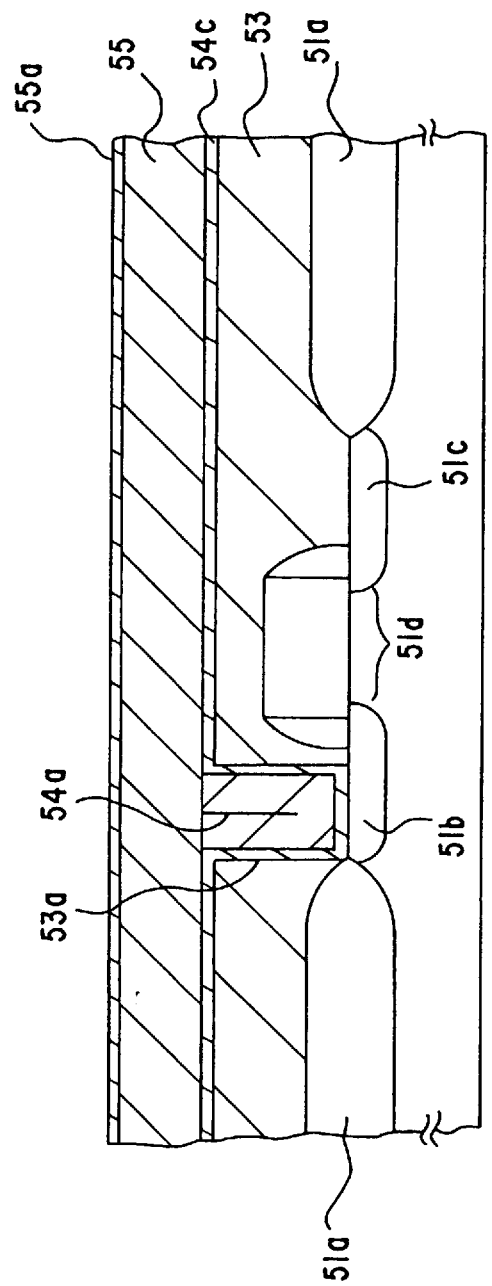

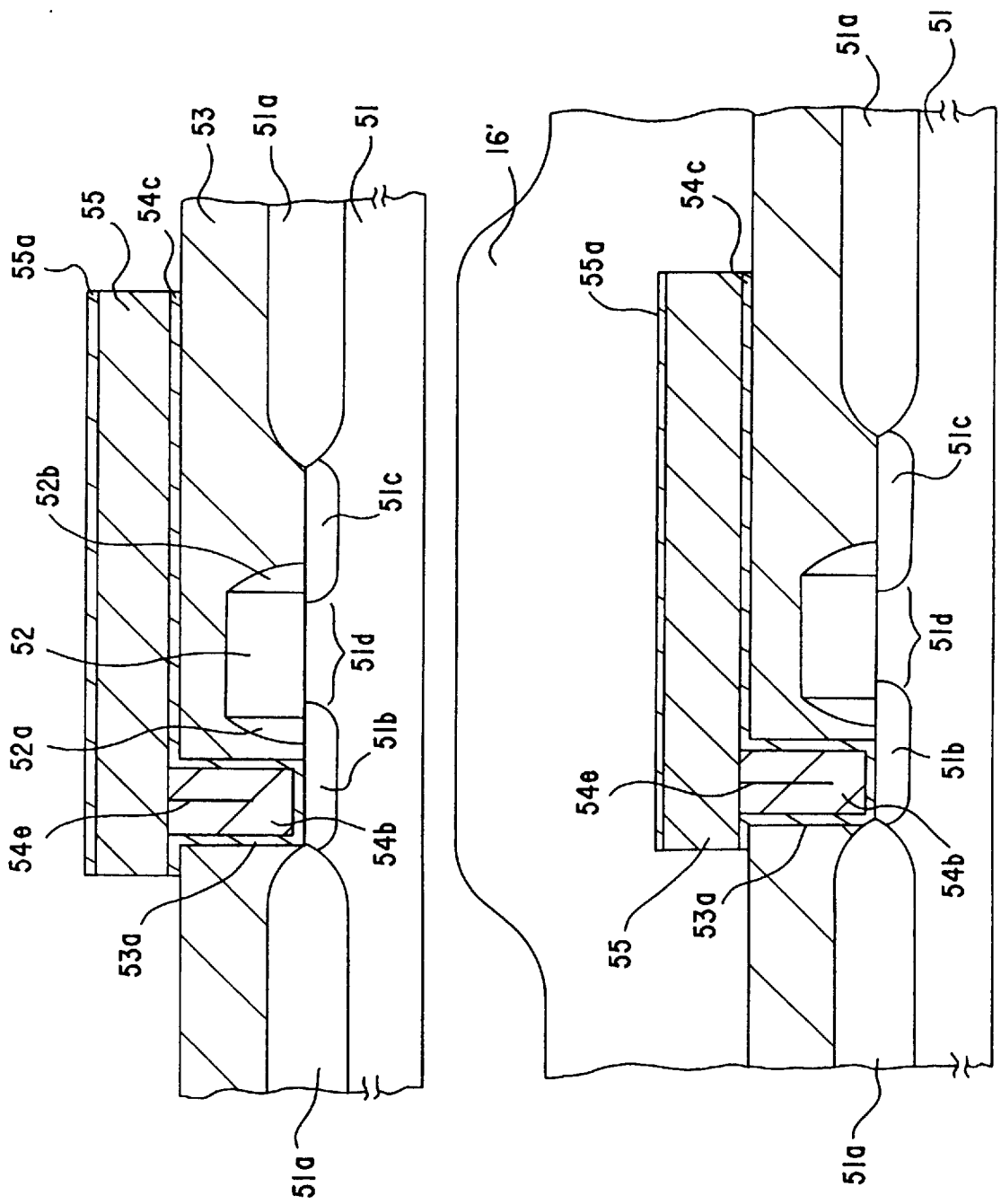

FIG.III

SLURRY CONTAINING MANGANESE OXIDE

This application is a divisional of U.S. Ser. No. 08/674,507, filed Jul. 2, 1996, now U.S. Pat. No. 5,763,325.

BACKGROUND OF THE INVENTION

The present invention generally relates to fabrication of semiconductor devices and more particularly to a fabrication method of a semiconductor device including a polishing step, as well as to a slurry used for such a polishing step.

In semiconductor integrated circuits, a multilayer interconnection structure is used commonly for achieving electric interconnection between various semiconductor devices formed on a common semiconductor substrate. A multilayer interconnection structure generally includes an insulation layer provided on the semiconductor substrate and a wiring pattern embedded in such an insulation layer. As such a multilayer interconnection structure includes a plurality of interconnection layers stacked with each other, it is necessary that each interconnection layer has a flat upper major surface for allowing such a stacking of the interconnection layers thereon.

Thus, it has been practiced conventionally to form such a multilayer interconnection structure by: forming a contact hole or wiring groove on an insulation layer; filling the contact hole or wiring groove by a conductor layer; and polishing the conductor layer until the surface of the insulation layer is exposed. Thereby, a flat surface is guaranteed for each of the interconnection layer, and the formation of another interconnection layer including an insulation layer and a conductor pattern embedded therein, is substantially facilitated.

FIGS. 1A–1J show the process of forming such a multilayer interconnection structure including a polishing step as applied to a fabrication process of a MOS transistor.

Referring to FIG. 1A, the MOS transistor is formed on a Si substrate 1 doped to the p-type in correspondence to an active region 1A defined by a field oxide film 1a. More specifically, the MOS transistor includes a diffusion region 1b of the n$^+$-type formed on the surface of the active region 1A and another diffusion region 1c also of the n$^+$-type formed on the surface of the active region 1A, wherein the diffusion region 1b and the diffusion region 1c are separated from each other by a channel region 1d of the MOS transistor. On the substrate 1, there is provided a gate electrode 2 so as to cover the channel region 1d with an intervening gate oxide film (not shown). Further, the gate electrode 2 carries side wall insulation films 2a and 2b on respective opposing side walls. It should be noted that the diffusion regions 1b and 1c act respectively as a source and a drain of the MOS transistor.

In the step of FIG. 1A, an interlayer insulation film 3 of SiO$_2$ is deposited by a CVD process so as to bury the MOS transistor formed as such, typically with a thickness of about 50 nm. As a result of deposition of the interlayer insulation film 3, the gate electrode 2 as well as the diffusion regions 1b and 1c are covered by the SiO$_2$ film 3. Thereby, the interlayer insulation film 3 shows a projection and a depression in conformity with the foregoing gate electrode 2 as indicated in FIG. 1A.

Next, in the step of FIG. 1B, the structure of FIG. 1A is planarized by polishing the surface of the insulation film 3 uniformly. Further, in the step of FIG. 1C, the insulation film 3 is subjected to a photolithographic patterning process, in which a contact hole 3a is formed in the interlayer insulation film 3 so as to expose the surface of the diffusion region 1b, and a conductor layer 4 of a metal or alloy such as W, Al or Cu, is deposited in the step of FIG. 1D on the structure of FIG. 1C uniformly by a CVD process. As a result, the conductor layer 4 fills the contact hole 3a and the conductor layer 4 contacts with the diffusion region 1b at the foregoing contact hole 3a. As the conductor layer 4 fills the contact hole 3a as noted above, the conductor layer 4 shows a depression on the upper major surface thereof in correspondence to the contact hole 3a.

Next, the conductor layer 4 is polished uniformly, and a structure shown in FIG. 1E is obtained. In the structure of FIG. 1E, it should be noted that a flat surface is obtained in correspondence to the upper major surface of the insulation layer 3. Preferably, the polishing of the conductor layer 4 acts selectively to the metal forming the conductor layer 4 and stops more or less spontaneously upon exposure of the upper major surface of the insulation film 3. As a result of such a polishing, a conductive plug 4b is formed in contact with the diffusion region 1b such that the conductive plug 4b fills the contact hole 3a. As a result of the planarization, achieved by the polishing process, the conductive plug 4b has an upper major surface coincident to the upper major surface of the insulation film 3.

Next, in the step of FIG. 1F, another insulation film 5 of SiO$_2$, and the like, is formed on the planarized structure of FIG. 1E, followed by a photolithographic patterning process, to form a groove 5a as indicated in FIG. 1G, such that the groove 5a exposes the conductive plug 4b. Further, in the step of FIG. 1H, another conductor layer 6, typically formed of a metal or alloy of W, Al, Cu, and the like, is deposited on the structure of FIG. 1G. As a result, a depression 6a is formed on the conductor layer 6 as indicated in FIG. 1H in correspondence to the groove 5a.

Further, the conductor layer 6 is polished in the step of FIG. 1I to form a planarized structure, wherein it will be noted that the groove 5a is filled by a conductor pattern 6b that forms a part of the foregoing conductor layer 6. After the structure of FIG. 1I is thus formed, another insulation film 7 is provided as indicated in FIG. 1J. Thereby, it is possible to form various interconnection patterns on the insulation film 7.

In the foregoing fabrication process, it has been practiced to carry out the polishing steps of FIG. 1E and FIG. 1I on an abrasive cloth of a urethane resin, by using a mixture of $\alpha$-Al$_2$O$_3$ and H$_2$O$_2$ as the slurry. A typical example of the slurry is MSW-1000 (trade name) supplied from Rodel. When using such a mixture of $\alpha$-Al$_2$O$_3$ and H$_2$O$_2$ as the slurry, H$_2$O$_2$ causes an oxidation in the conductor layer to be polished, and the $\alpha$-Al$_2$O$_3$ abrasive particles grind away the oxides formed as a result of the oxidation of the conductor layer.

For example, the grinding of a W layer by means of the foregoing slurry first causes a formation of W$_x$O$_y$ as a result of the oxidation by H$_2$O$_2$, while the foregoing oxide (W$_x$O$_y$) is easily removed by the $\alpha$-Al$_2$O$_3$ grains.

On the other hand, the use of such a conventional slurry, which contains H$_2$O$_2$, a strong liquid oxidant, causes a problem, when applied to the polishing of a conductor layer such as W or other metal, in that H$_2$O$_2$ penetrates deeply into the conductor layer 4 filling the contact hole 3a along a seam 4c that is formed in the conductor layer 4 at the time of deposition of the conductor layer 4. Thereby, the polishing of the conductor layer 4, conducted under existence of H$_2$O$_2$, enlarges the depression from the state of FIG. 2A to the state of FIG. 2B. In other words, there is formed a large and deep depression generally at the center of the conductive plug 4b in correspondence to the foregoing seam 4c as indicated in FIG. 2B, while such a large depression causes a problem of reliability of electrical contact at the contact hole 3a. The problem of the formation of the depression in the contact hole as a result of polishing becomes particularly serious in high density integrated circuits and semiconductor devices in which the diameter of the contact hole 3a is 0.5 µm or less.

It should be noted that the foregoing seam 4c is formed as a result of abutting of the conductor layers growing from both lateral side walls of the contact hole 3a toward the center of the contact hole when the conductor layer is deposited. Because of the nature of the seam as such, the seam 4c contains a large amount of defects or imperfections and is extremely vulnerable to oxidation by $H_2O_2$. The oxidized part of the plug 4b is easily removed by polishing using abrasive particles such as $\alpha$-$Al_2O_3$.

Further, such conventional slurries have suffered from the problem of relatively low selectivity in that the polishing does not stop exactly at the interface between an insulator layer and a conductor layer. Thereby, there is a substantial risk that the layer that should not be polished is unwantedly polished by the abrasive particles.

SUMMARY OF THE INVENTION

Accordingly, it is a general object of the present invention to provide a novel and useful method of fabricating a semiconductor device including a polishing process wherein the foregoing problems are successfully eliminated.

Another and more specific object of the present invention is to provide a slurry containing $MnO_2$ abrasives dispersed in a solvent as well as a fabrication process of a semiconductor device using such a slurry in a polishing process, wherein the slurry acts upon an insulation layer with enhanced selectivity.

Another object of the present invention is to provide a slurry, comprising:

abrasive particles of $MnO_2$;

a solvent in which said abrasive particles are dispersed; and an additive containing a benzene ring, added to said solvent.

Another object of the present invention is to provide a slurry, comprising:

abrasive particles of $MnO_2$;

a solvent of $H_2O$ in which said abrasive particles are dispersed; and an additive added to said solvent;

said additive being selected from a lactic acid and lactose.

Another object of the present invention is to provide an abrasive method for polishing an object, comprising a step of:

polishing said object by a slurry, said slurry containing abrasive particles of $MnO_2$, a solvent in which said abrasive particles are dispersed, and an additive added to said solvent, said additive being selected from a group consisting of a potassium phthalate, an ammonium phthalate, a phthalic acid, a benzoic acid, an anthranilate, an anthranilic acid, a lactic acid and a lactose.

Another object of the present invention is to provide a method of fabricating a semiconductor device, comprising the steps of:

forming a non-insulator layer on an insulator layer; and polishing said non-insulator layer until said insulator layer is exposed, said step of polishing being conducted by a slurry said slurry including abrasive particles of $MnO_2$, a solvent in which said abrasive particles are dispersed, and an additive added to said solvent, said solvent being selected from a group consisting of a potassium phthalate, an ammonium phthalate, a phthalic acid, a benzoic acid, an anthranilate, an anthranilic acid, a lactic acid, and a lactose.

According to the present invention, the slurry, which contains $MnO_2$ as a primary component of the abrasive particles, can successfully and efficiently polish the conductor layer, while the polishing stops spontaneously and exactly upon exposure of the underlying insulation layer.

By using $MnO_2$ for the abrasive particles, the abrasive particles act as a strong solid oxidant by releasing oxygen, and the conductor layer to be polished is oxidized efficiently. The metal oxide formed as a result of the oxidation is easily removed by a grinding process associated with the polishing process by the abrasive particles.

For example, $MnO_2$ acts upon W according to the reaction

$$MnO_2 + W \rightarrow Mn_2O_3 + W_xO_y,$$

wherein $W_xO_y$ is easily removed as a result of grinding by the $Mn_2O_3$ product or by the unreacted $MnO_2$ abrasive particles.

As the abrasive particles act as an oxidant (solid oxidant) as indicated in the above reaction, the present invention does not require fluid oxidant such as $H_2O_2$ in the solvent. Thereby, the problem of erosion of the seam, caused by the penetration of the fluid oxidant into the seam as in the case of FIG. 2B, is successfully avoided, and a reliable electric contact is achieved.

By adding a compound containing benzene ring, such as a phthalate or phthalic acid, an anthranilate or anthranilic acid, benzoic acid, and the like, to the solvent, it is possible to increase the rate of polishing of the conductor layer significantly over the polishing rate of the insulation layer. Further, any compound selected from lactic acid and lactose may be added for the same purpose.

Another object of the present invention is to provide a slurry containing $MnO_2$ abrasives as well as a fabrication process of a semiconductor device using such a slurry in a polishing process, wherein the slurry acts both upon a conductor layer and an insulation layer.

Another object of the present invention is to provide a process of fabricating a semiconductor device, comprising:

a step of polishing an insulation film containing Si and O, said step of polishing being carried out by a slurry containing $MnO_2$ particles as abrasive particles.

It was discovered that the slurry of the present invention can also polish an insulator layer when the polishing condition is appropriately optimized. In such a case it is believed that the oxygen atoms released from the $MnO_2$ abrasive particles cut the Si—O—Si network forming the insulator layer. Thereby, polishing of the insulator layer is substantially facilitated even when the abrasive particles have a Mohs hardness smaller than that of the insulator layer. As the slurry is extremely effective for polishing conductor layers, it is possible to use the slurry for polishing a conductor layer and an insulator layer simultaneously. Further, change of the slurry in the process of polishing a conductor layer and in the process of polishing an insulator layer is no longer necessary. This, in turn, means that one can substantially simplify the treatment of the sludge formed after the polishing process.

Another object of the present invention is to provide a process for fabricating a semiconductor device including a polishing step that uses a slurry containing $MnO_2$ abrasives, wherein the polishing step further uses a polishing stopper layer such that the polishing stops spontaneously upon an exposure of the polishing stopper layer.

Another object of the present invention is to provide a fabrication process of a semiconductor device including a polishing step, comprising the steps of:

depositing a nitride film of a refractory element on a first layer;

depositing a second layer; and polishing said second layer by a slurry containing abrasive particles of $MnO_2$ and a solvent.

According to the present invention, the polishing stops spontaneously upon the exposure of the nitride film, as the slurry acts little against the nitride film. In other words, the nitride film acts as an effective polishing stopper. By providing such a nitride film, it is possible to control the thickness of the layers forming the semiconductor device exactly.

Other objects and further features of the present invention will become apparent from the following detailed description when read in conjunction with the attached drawings.

BRIEF DESCRIPTION OF THE DRAWINGS

FIGS. 1A–1J are diagrams showing a conventional fabrication process of a semiconductor device including a polishing step;

FIGS. 11A–11I are diagrams showing a fabrication process of a semiconductor device according to the third embodiment of the present invention;

DETAILED DESCRIPTION OF THE PREFERRED EMBODIMENTS

[FIRST EMBODIMENT]

Figure 3:
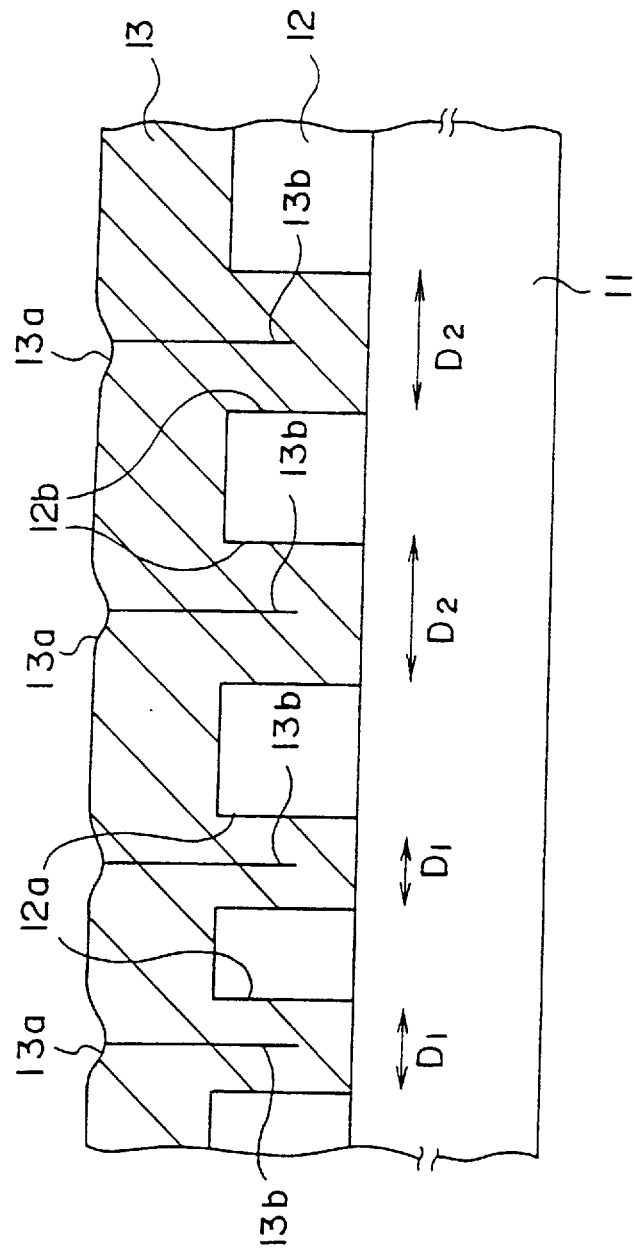
FIG. 3 is a diagram showing the construction of a test piece used in an experiment forming the basis of the present invention for investigating the polishing rate achieved by various slurries.

FIG. 3 shows a test piece used in a first embodiment of the present invention for investigating the performance of various slurries.

Figures 1A, 1B:
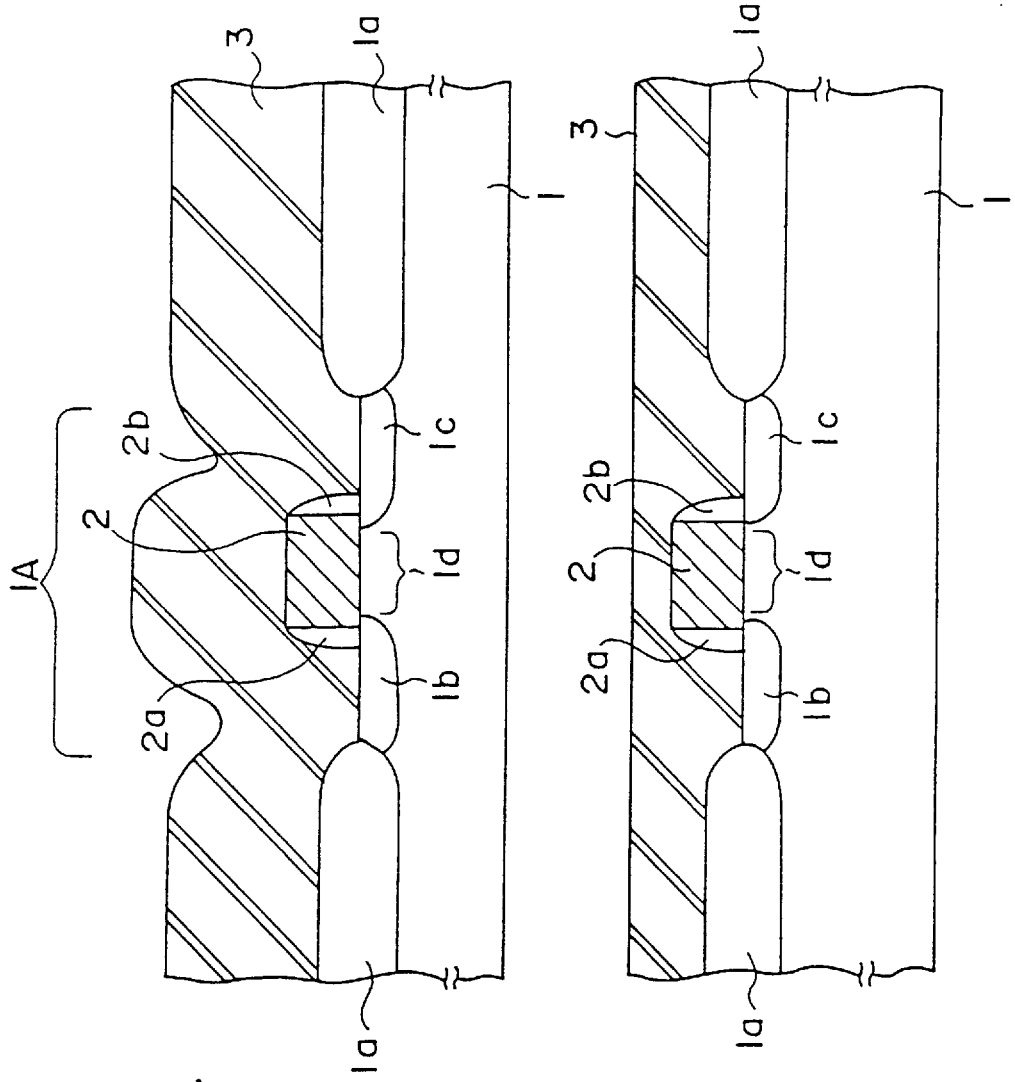
Figures 1E, 1F:
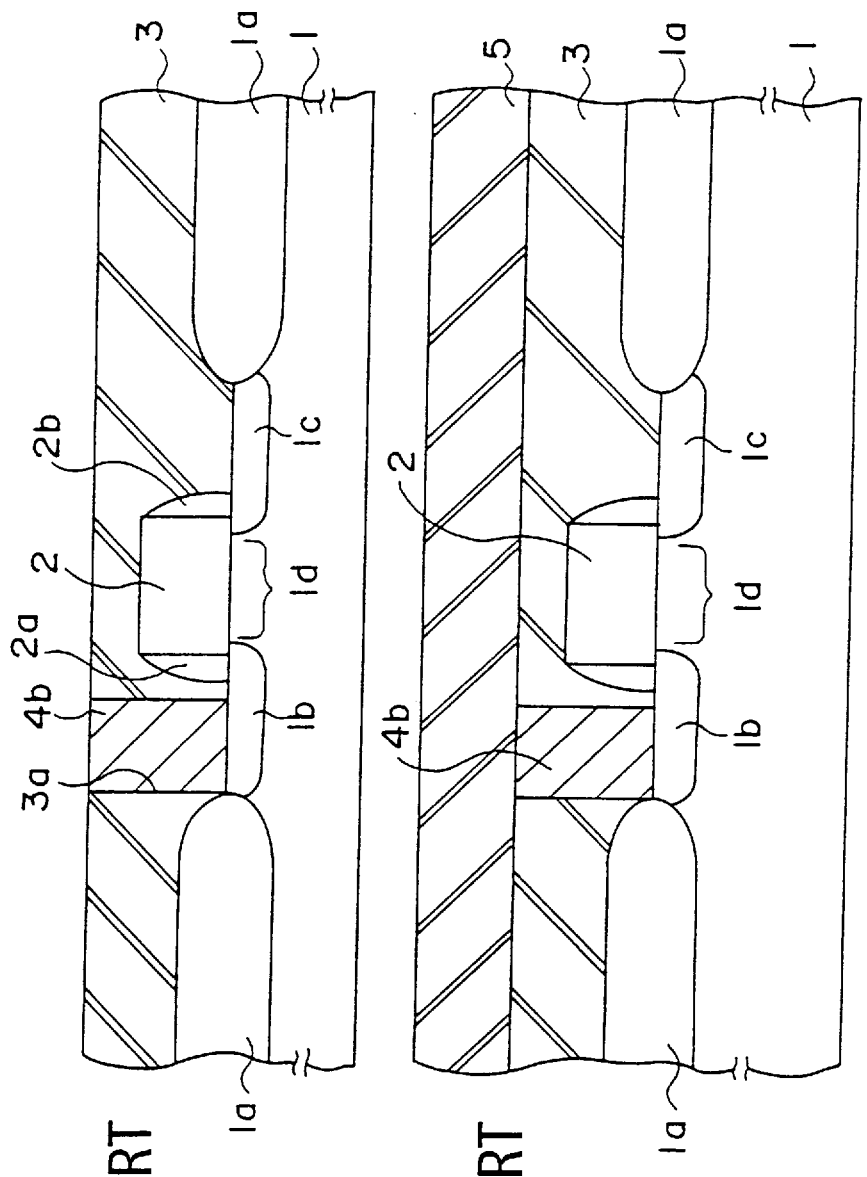
Figure 1G:
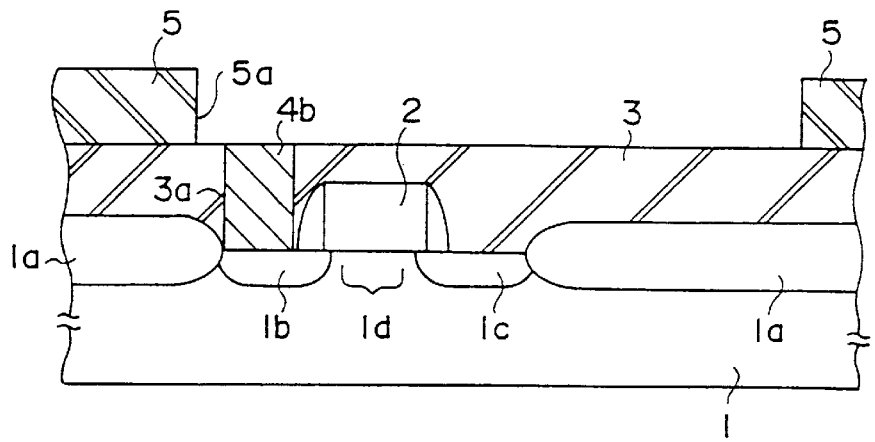
Figure 1H:
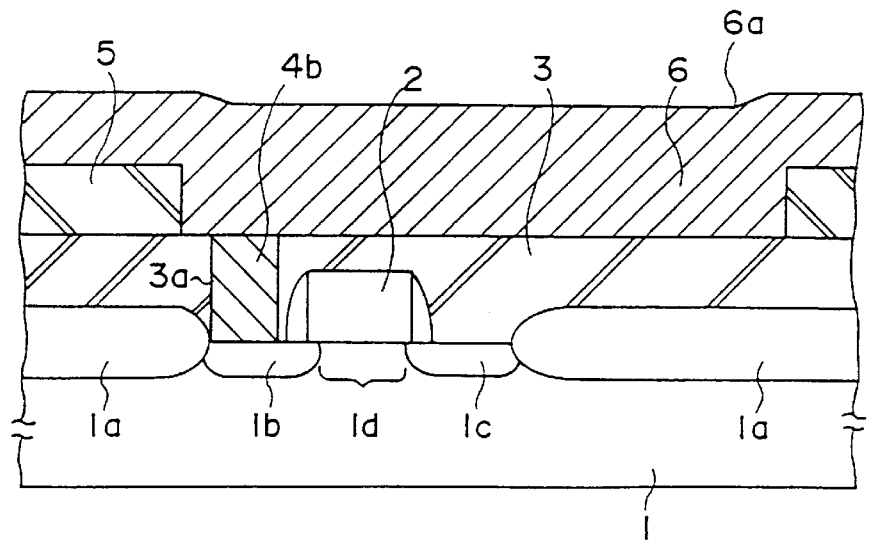
Figure 1I:
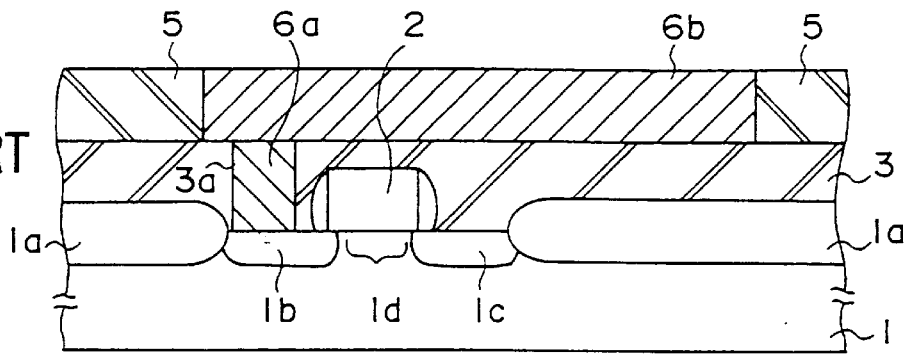
Figure 1J:
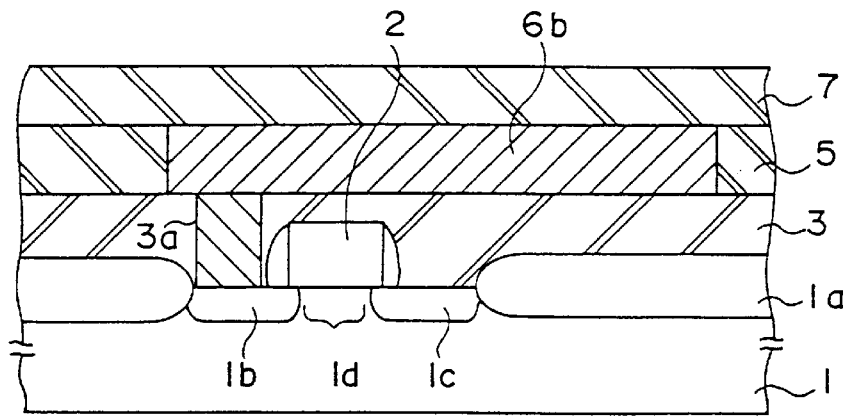
Figure 2A:
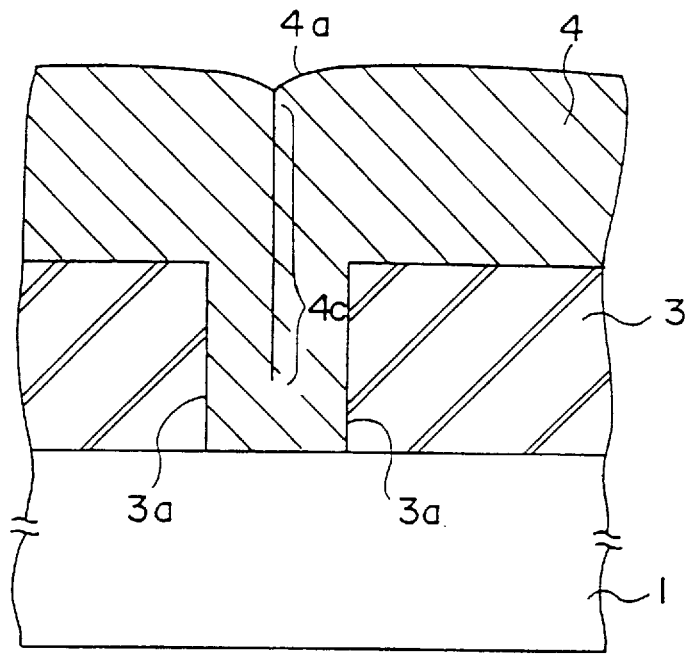
FIGS. 2A and 2B are diagrams showing the problem of erosion of the seam occurring in the conventional polishing process.

Referring to FIG. 3, the test piece is constructed on a Si substrate 11 and includes a $SiO_2$ film 12 deposited on the Si substrate 11 by a CVD process, with a thickness of about 50 nm. The $SiO_2$ film 12 is provided with a plurality of contact holes 12a and 12b with respective inner diameters $D_1$ and $D_2$, and a conductor layer 13 of W is deposited on the $SiO_2$ film 12 so as to fill the contact holes 12a and 12b with a thickness of about 50 nm. The conductor layer 13 is deposited by a CVD process, and depressions 13a are formed on the upper major surface thereof in correspondence to the contact holes 12a and 12b. As already explained with reference to FIGS. 2A and 2B, the W layer 13 includes a seam 13b in each of the depressions 13a as a result of abutting of growing W layers that occurs when the W layer 13 fills the contact hole 12a. Because of the nature of the seam as such, the seams 13b inevitably contain a large amount of crystal imperfections or defects.

Figure 4:
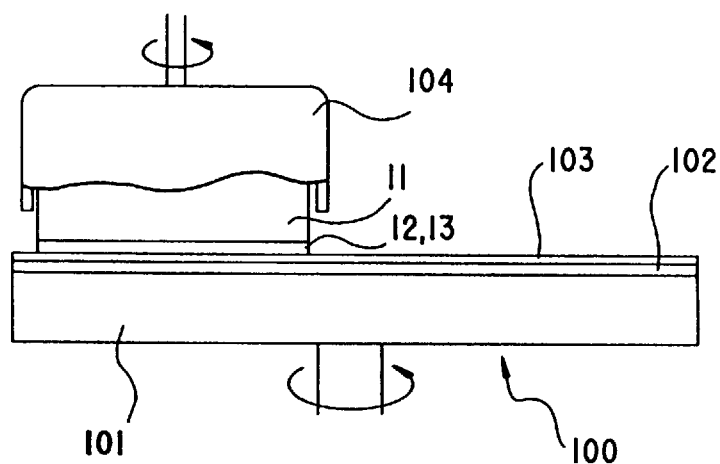
FIG. 4 is a diagram showing the construction of the polishing apparatus used in the present invention schematically.

In the experiment, the test piece of FIG. 3 was subjected to a polishing process conducted by an apparatus 100 shown in FIG. 4.

Referring to FIG. 4, the polishing apparatus 100 includes a turntable 101 covered by a urethane cloth 102 supplied from Rodel-Nitta with a trade name of SUBA400. The test piece of FIG. 3 is held by a polishing head 104 that revolves in a direction identical to the rotating direction of the turntable 101, and the polishing is applied upon the W layer 13 on the foregoing urethane cloth 102 while urging the test piece against the turntable 101 with a pressure of 200–700 g/cm In the experiment, a slurry containing $MnO_2$ as the abrasive particles and $H_2O$ as the solvent was used on the cloth 102 as indicated schematically by a reference numeral 103, wherein the concentration of the $MnO_2$ abrasive particles was adjusted to be about 20 percent by weight in one example.

Figure 2B:
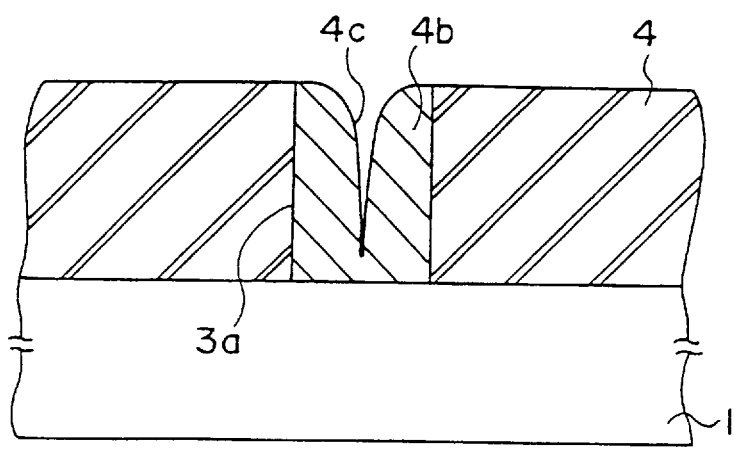

After the polishing, an over-etching was applied to the polished surface, and the evaluation was made by measuring the depth of the depressions such as the one shown in FIG. 2B, by observing the cross section of the test piece under an electron microscope.

Figure 5:
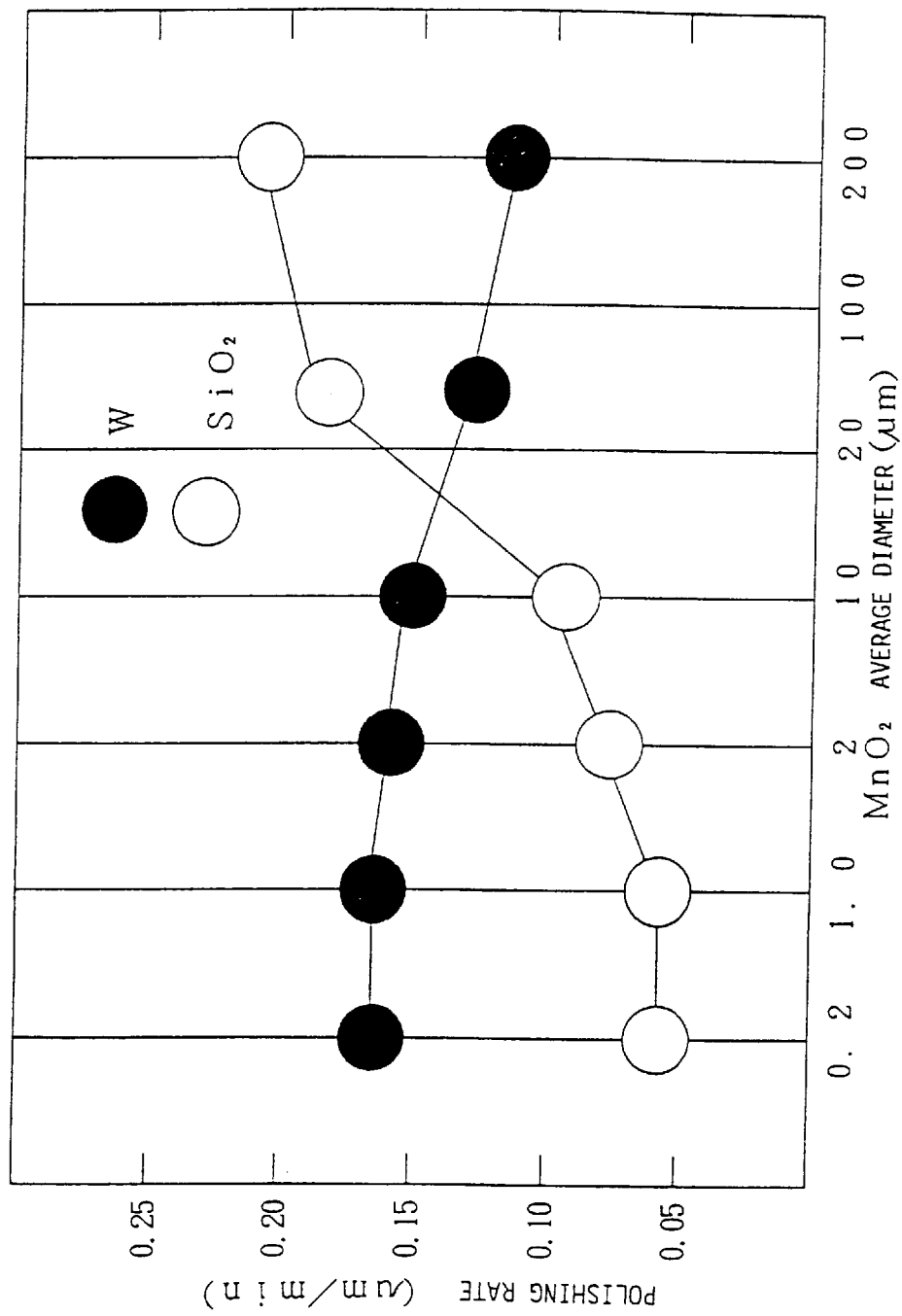
FIG. 5 is a graph showing the result of the experiment.

FIG. 5 shows the polishing rate of the W layer 13 in comparison with an $SiO_2$ layer that is provided on the test piece of FIG. 3 in place of the W layer 13, wherein the polishing rate observed for the W layer 13 is designated by solid circles while the polishing rate observed for the $SiO_2$ layer is designated by open circles.

Referring to FIG. 5, it will be noted that the polishing rate for the W layer exceeds the polishing rate for the $SiO_2$ layer substantially, as long as the grain size of the $MnO_2$ abrasive is smaller than about 10 μm. This means that the $MnO_2$ abrasive particles act upon a W layer selectively and efficiently, while the polishing stops immediately when the $SiO_2$ layer is exposed. In other words, an $SiO_2$ layer acts as a polishing stopper in the polishing process of a W layer.

When the grain size of the $MnO_2$ particles exceeds 10 $\mu$m, on the other hand, the polishing rate for the $SiO_2$ layer exceeds the polishing rate for the W layer. Thus, in order to polish a W layer while using a $SiO_2$ layer as an etching stopper, it is necessary or preferable to adjust the grain size of the $MnO_2$ abrasive particles well below 10 $\mu$m.

Thus, it was discovered that the slurry containing $MnO_2$ abrasive particles acts selectively against a conductor layer such as a W layer as compared with an $SiO_2$ layer, in which the polishing rate of the W layer is 2–3 times as large as the polishing rate of the $SiO_2$ layer.

In order to increase the selectivity of polishing further, the inventors of the present invention conducted an investigation for optimum composition of the solvent that is used in the $MnO_2$ slurry in combination with the $MnO_2$ abrasive particles.

EXPERIMENT 1

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, potassium phthalate was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 2

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, ammonium phthalate was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 3

In the present experiment, a slurry was prepared by mixing the particles of $MnO_2$ having an average diameter of 1.0 $\mu$m and a solvent of $H_2O$ or a lower alcohol, in which the amount of the $MnO_2$ abrasive particles was adjusted to be 10% by weight in the slurry. Further, phthalic acid was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 4

In the present experiment, a slurry was prepared by mixing the particles of $MnO_2$ having an average diameter of 1.0 $\mu$m and a solvent of $H_2O$ or a lower alcohol, in which the amount of the $MnO_2$ abrasive particles was adjusted to be 10% by weight in the slurry. Further, benzoic acid was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 5

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, anthranilic acid was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 6

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, anthranilate was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 7

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, lactic acid was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 8

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, lactose was added to the solvent as an additive, with a proportion of 10% by weight.

After polishing a test piece carrying a W layer or a $SiO_2$ layer on a substrate, it was discovered that the slurry having such a composition provides a significantly improved selectivity of polishing, such that the polishing rate of a W layer is 20 times or more as compared with the polishing rate of a $SiO_2$ layer.

EXPERIMENT 9

In the present experiment, a slurry was prepared by mixing the particles of $MnO_2$ having an average diameter of 1.0 $\mu$m and a solvent of $H_2O$, in which the amount of the $MnO_2$ abrasive particles was adjusted to be 10% by weight in the slurry. Further, $BaSO_4$ was added to the solvent as an additive, with a proportion of 10% by weight.

After polishing a test piece carrying a W layer or a $SiO_2$ layer on a substrate, it was discovered that the slurry having such a composition provides an improved selectivity of polishing, such that the polishing rate of a W layer is 20 times or more as compared with the polishing rate of a $SiO_2$ layer.

Summarizing above, the selectivity of polishing is improved significantly when the compounds containing a benzene ring such as potassium phthalate, ammonium phthalate, phthalic acid, benzoic acid, anthranilate or anthranilic acid, is used in the solvent in combination with the abrasive particles of $MnO_2$. Further, a similar improvement of selectivity of polishing is achieved when lactic acid or lactose is used in the solvent in combination with the abrasive particles of $MnO_2$.

[SECOND EMBODIMENT]

In the course of the investigation of the slurry using $MnO_2$ for the abrasive particles, the inventors of the present invention have discovered that the slurry of the present invention in ineffective for polishing a nitride film of a refractory metal element such as TiN, which is commonly used as a diffusion barrier. In other words, it was discovered that a nitride film of a refractory metal element can be used as an effective polishing stopper against the slurry of the present invention.

More specifically, a silicon substrate covered by a TiN film was prepared and mounted upon the head 104 of the apparatus of FIG. 4, and the TiN film was polished by using a slurry in which $MnO_2$ particles are dispersed in a $H_2O$ solvent with a proportion of 7% by weight. After the polishing conducted for 5 minutes under the head pressure of 370 g/cm$^2$ while rotating the turntable 101 at with a rotational speed of 40 rpm and simultaneously revolving the head 7 in the same direction at a rotational speed also of 40 rpm, it was confirmed that there is no increase of the sheet resistance of the TiN film. In other words, the TiN film remained substantially intact after such a polishing. In the foregoing experiment, SUBA400 of Rodel-Nitta was used for the polishing cloth.

In another experiment, the inventors added $Al_2O_3$ particles into the $MnO_2$ particles when polishing the TiN film. In this case, it was confirmed that the TiN film is polished with a rate of 0.5 μm/min. When $SiO_2$ particles (colloidal silica) were added to the $MnO_2$ particles, the TiN film was polished with a rate of 0.2 μm/min.

FIGS. 6A–6H show the fabrication process of a semiconductor device, particularly a multilayer interconnection structure, according to a second embodiment of the present invention.

Figure 6A:
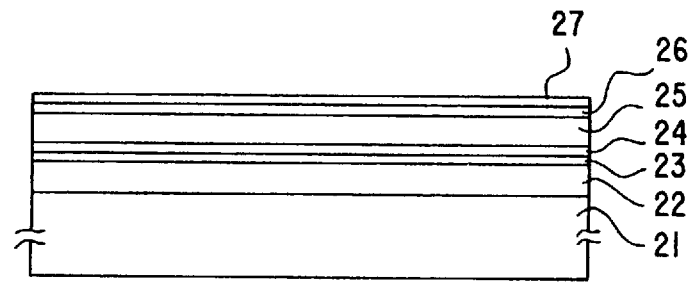
FIGS. 6A–6H are diagrams showing a fabrication process of a semiconductor device according to a second embodiment of the present invention.

Referring to FIG. 6A, a Si substrate 21 is covered by a plasma-deposited $SiO_2$ film 22 (plasma TEOS-NSG film) having a thickness of 0.8 μm, on which a TiN film 23 of 0.05 μm thickness and a Ti film 24 of 0.1 μm thickness are deposited consecutively, and an Al alloy (Al—Si—Cu alloy) layer 25 is deposited further on the Ti film 24 with a thickness of 0.4 μm. Further, another Ti film 26 and another TiN film 27 are deposited consecutively on the Al alloy layer 25 respectively with a thickness of 0.05 μm and a thickness of 0.1 μm.

Figure 6B:
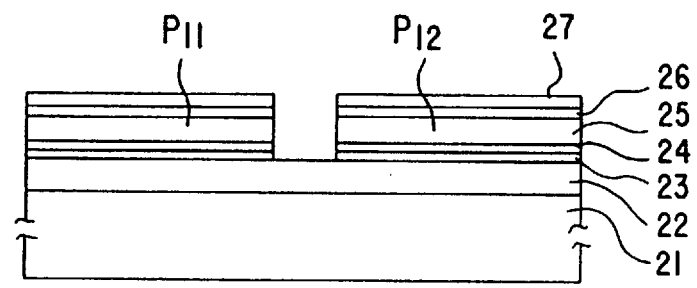

Next, in the step of FIG. 6B, the structure of FIG. 6A is patterned by a dry etching process such that the dry etching penetrates up to the TiN film 23, and a first conductor pattern $P_{11}$ and a second conductor pattern $P_{12}$ are formed as a result of such a patterning.

Figure 6C:
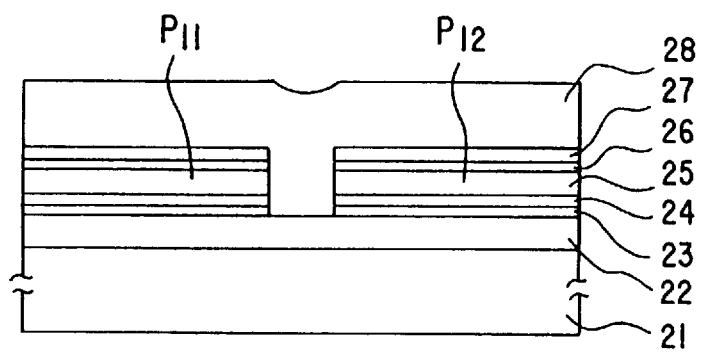

Next, in the step of FIG. 6C, a $SiO_2$ film 28 is deposited on the structure of FIG. 6B by a plasma deposition process (plasma TEOS-NSG film) with a thickness of 1.0 μm such that the $SiO_2$ film fills the groove separating the patterns $P_{11}$ and $P_{12}$ from each other.

Figure 6D:
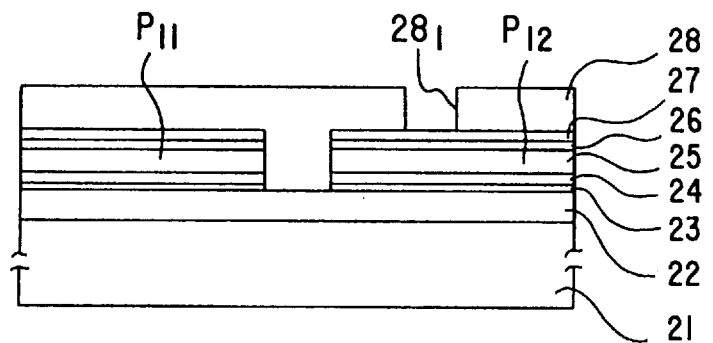

Further, in the step of FIG. 6D, the $SiO_2$ film 28 is subjected to a polishing process conducted on a urethane cloth (IC1000) while using a colloidal silica (SC112) as a slurry, and the $SiO_2$ film 28 is planarized as indicated in FIG. 6D. Further, a contact hole $28_1$ is formed in the $SiO_2$ film 28 so as to expose a part of the TiN film 27.

Figure 6E:
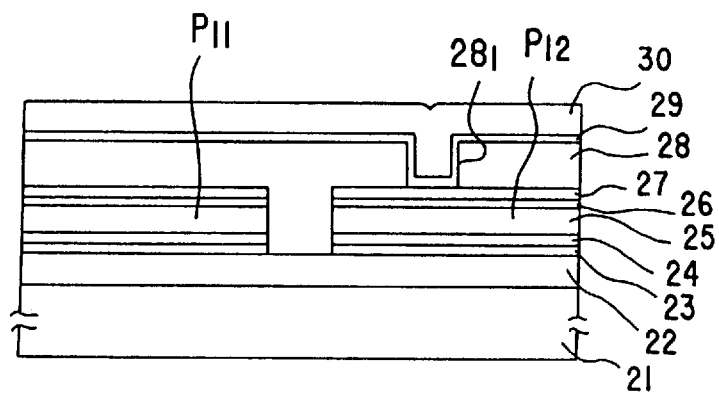

Next, in the step of FIG. 6E, a TiN film 29 is provided on the structure of FIG. 6D including the contact hole $28_1$ as well as the exposed surface of the TiN film 27 with a thickness of 0.05 μm, and a conductor layer 30 of W is deposited further on the TiN film 29 by a CVD process with a thickness of 0.7 μm.

Figure 6F:
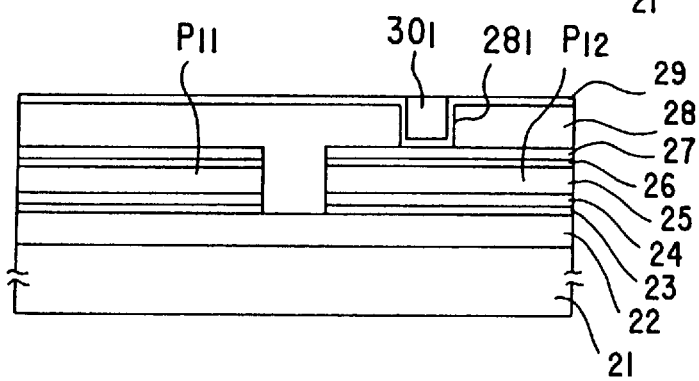

After the step of FIG. 6E, the W layer 30 is polished in the step of FIG. 6F by using a slurry containing $MnO_2$ as the abrasive particles, wherein the W layer 30 is effectively and selectively removed as a result of such a polishing, leaving behind a conductive plug $30_1$ of W. In such a polishing process, the polishing stops spontaneously and exactly upon the exposure of the TiN film 29, because of the characteristically small polishing rate of TiN by the $MnO_2$ abrasives. No substantial change of thickness occurs in the TiN film 29 even after the polishing process.

Figure 6G:
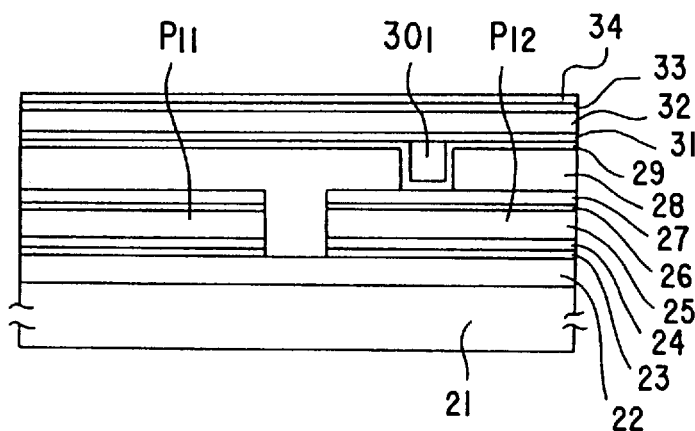
Figure 6H:
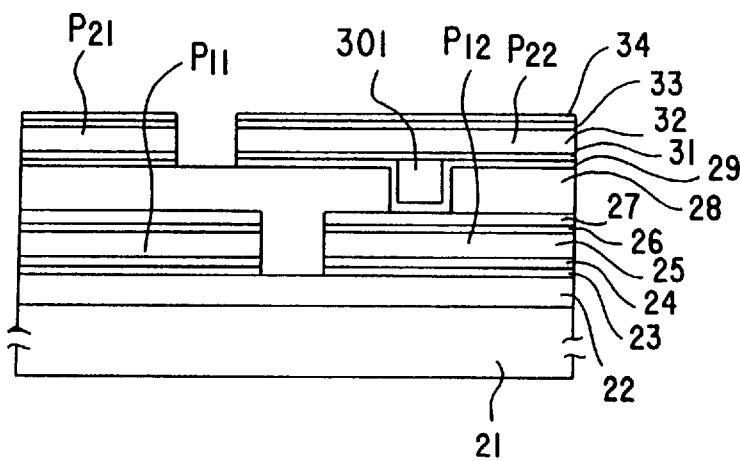

Next, in the step of FIG. 6G, a Ti film 31, an Al alloy film 32, another Ti film 33 and another TiN film 34 are deposited on the TiN film 29 including the W plug $30_1$, respectively with thicknesses of 0.1 μm, 0.4 μm, 0.05 μgm and 0.1 μm, followed by a patterning process of the films 31–34 in the step of FIG. 6H to form second layer conductor patterns $P_{21}$ and $P_{22}$, wherein the conductor pattern $P_{22}$ is connected electrically to the conductor pattern $P_{12}$ via the W plug $30_1$.

In the foregoing steps of FIGS. 6A–6H, the TiN films act as a diffusion barrier, while some of which (TiN film 29) act also as a polishing stopper in the polishing step of FIG. 6F.

In the process of the present embodiment, the TiN films are left unremoved, and the steps for removing such TiN films can be omitted. Further, the foregoing process does not use an annealing process used conventionally after deposition of the TiN films, while omission of the annealing process reduces the formation of a resistive layer between the Al alloy layer and the Ti layer.

As noted above, the polishing in the step of FIG. 6F stops exactly at the TiN film 29, Thereby, the thickness of the layer 28 underneath the TiN film 29 acting as a polishing stopper, is controlled exactly.

Figure 7A:
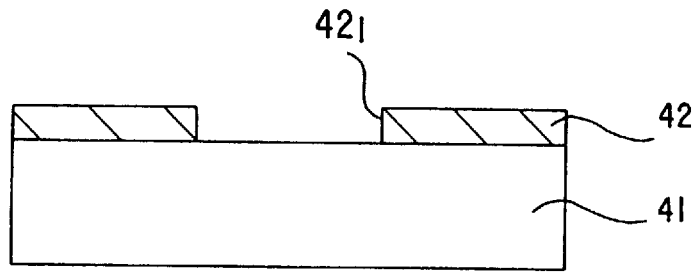
FIGS. 7A–7D are diagrams showing another fabrication process of a semiconductor device according to the second embodiment of the present invention.
Figure 7B:
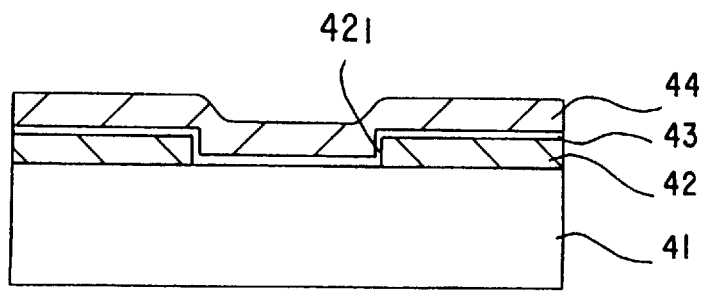
Figure 7C:
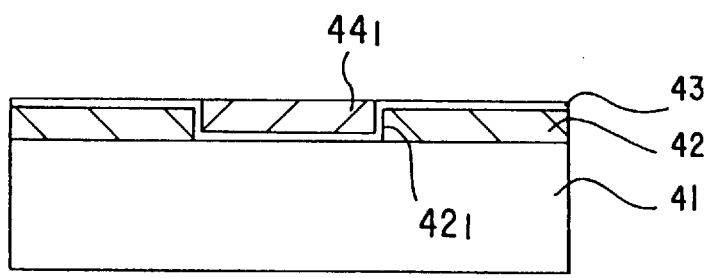

FIGS. 7A–7C show a modification of the present embodiment in which the slurry of the present invention is used in the process of forming an embedded wiring pattern.

Referring to FIG. 7A, a Si substrate 41 is covered by a $SiO_2$ film 42 deposited by a plasma deposition process (plasma TEOS NSG film) with a thickness of 0.5 μm, wherein a wiring groove $42_1$ is formed in the $SiO_2$ film 42 as a result of a selective etching process.

Next, in the step of FIG. 7B, a TiN film 43 is deposited on the structure of FIG. 7A by a CVD process with a thickness of 0.05 μm, followed by a deposition of a Cu layer 34 on the TiN film 43 with a thickness of 0.5 μm including the part covering the groove $42_1$.

Further, in the step of FIG. 7C, the Cu layer 44 is subjected to a polishing process conducted by the slurry of the present invention in which $MnO_2$ particles are dispersed in a $H_2O$ solvent. Thereby, the slurry acts effectively upon the Cu layer 44 and the polishing proceeds until the TiN film 43, acting as a polishing stopper, is exposed. Thereby a planarized structure indicated in FIG. 7C is obtained in which the Cu layer 44 fills the groove $42_1$.

Figure 7D:
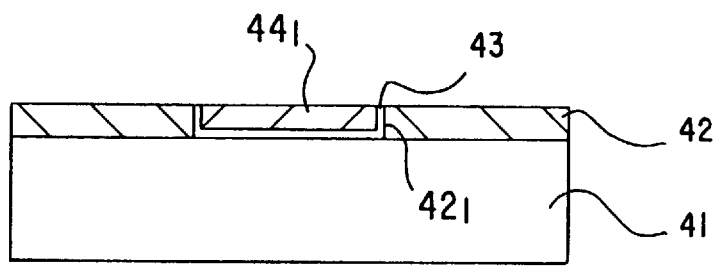

After the step of FIG. 7C, the polishing is continued while adding $Al_2O_3$ or $SiO_2$ abrasive particles to the slurry, and the TiN film 43 is removed thereby together with the part of the Cu layer 44 corresponding to the TiN film 43, and a structure of FIG. 7D is obtained.

[THIRD EMBODIMENT]

In the course of the investigation of the slurry using $MnO_2$ for the abrasive particles, the inventors of the present invention also discovered that the slurry can polish not only a conductor layer as noted above but also an insulation layer that contains therein a network of Si—O—Si.

Figure 8:
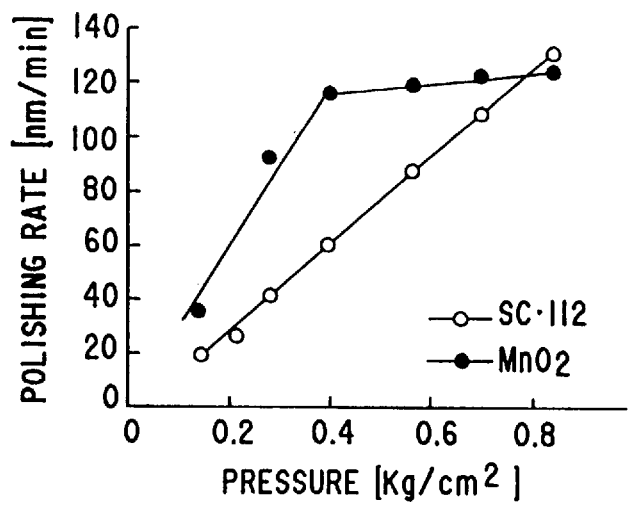
FIG. 8 is a diagram showing the relationship between a polishing rate and an urging pressure of a test piece for the case of the slurry containing $MnO_2$ particles according to a third embodiment of the present invention.

FIG. 8 shows the relationship observed between the polishing rate and the pressure when polishing a $SiO_2$ film deposited on a Si substrate, wherein the relationship indicated by open circles represent the case when a conventional colloidal silica abrasive is used, while the relationship indicated by solid circles represent the case in which the slurry of the present invention containing $MnO_2$ particles is used.

Referring to FIG. 8, the experiment was conducted by using the apparatus of FIG. 4 under the condition that the turntable 101, covered by a urethane cloth (IC1000) is rotated at a rotational speed of 40 rpm, while revolving simultaneously the sample held by the holder 104 in the same direction at a rotational speed of 40 rpm. When using the $MnO_2$ slurry, $MnO_2$ particles having an average diameter of 0.1 μm were dispersed in a $H_2O$ medium with a proportion of 7 wt %. On the other hand, a commercially available colloidal silica abrasive (SC112, a trade name of Gabbot, Inc.) was used for the colloidal silica abrasive of FIG. 8. The SC112 abrasive contains $SiO_2$ particles having an average diameter of 0.05 μm.

As can be seen clearly from FIG. 8. the $MnO_2$ particles, though having a smaller hardness as compared with $SiO_2$ particles, provide a larger polishing rate as long as the urging pressure of the test piece against the urethane cloth is maintained within the range between about 0.1 $kg/cm^2$ and 0.8 $kg/cm^2$.

Figure 9A:
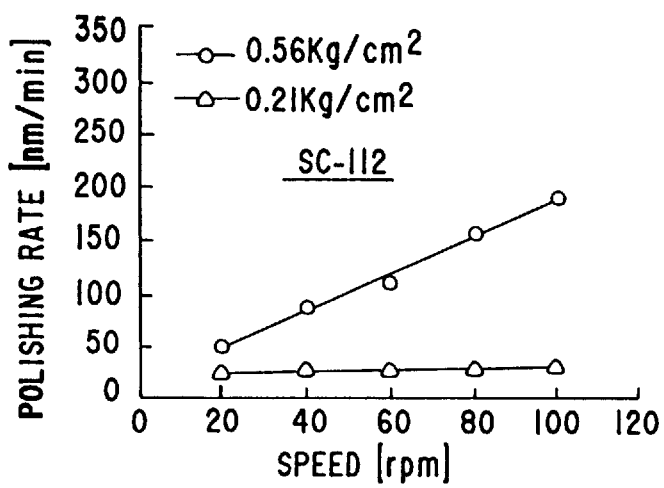
FIGS. 9A and 9B are diagrams showing the relationship between the polishing rate and the rotational speed of the turntable respectively for a conventional colloidal silica slurry and the slurry of the present invention using $MnO_2$ particles, according to the third embodiment of the present invention.
Figure 9B:
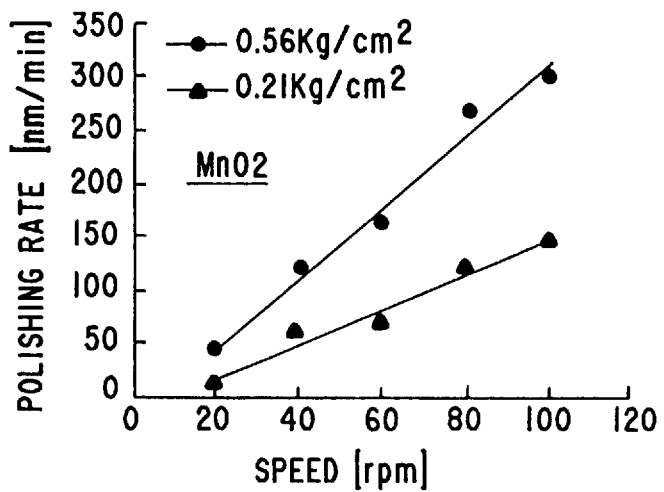

FIGS. 9A and 9B compare the relationship between the polishing rate and the rotational speed of the turntable between the case in which the commercially available colloidal silica abrasive is used (FIG.9A) and the case in which the abrasive of the present invention containing $MnO_2$ particles is used (FIG. 9B), In FIG. 9A, the open circles represent the result in which a pressure of 0.56 $kg/cm^2$ is used, while the open triangles represent the result in which a pressure of 0.21 $kg/cm^2$ is used. Similarly, the solid circles of FIG. 9B represent the result in which the polishing is made with the pressure of 0.56 $kg/cm^2$, while the solid triangles of FIG. 9B represent the result in which the polishing is made with the pressure of 0.21 $kg/cm^2$.

Figure 10A:
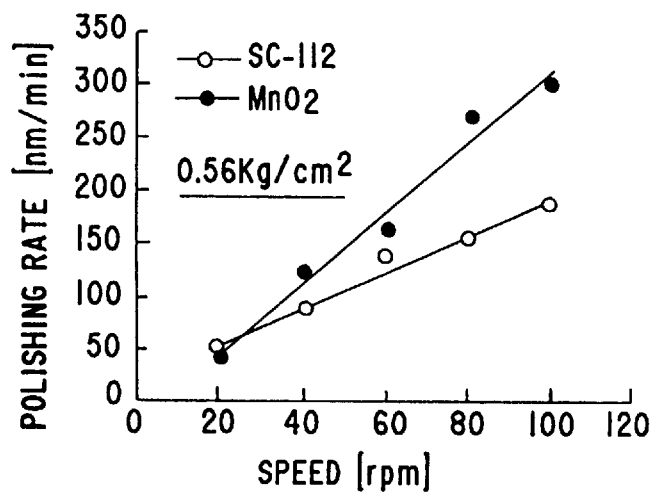
FIGS. 10A and 10B are diagrams showing the relationship between the polishing rate and the rotational speed for various urging pressures of the test piece according to the third embodiment of the present invention.
Figure 10B:
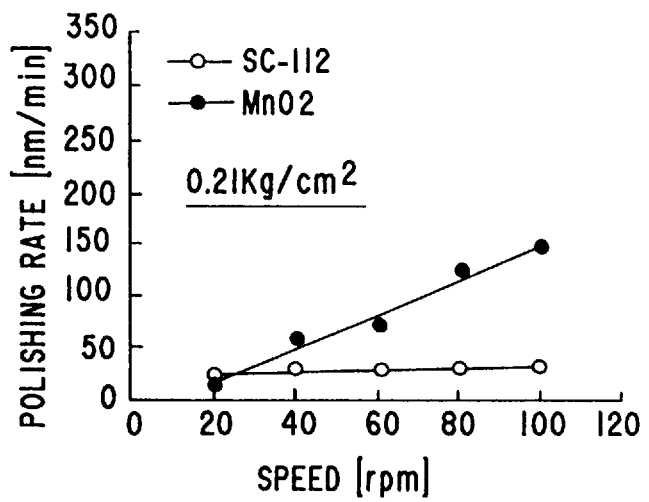

FIGS. 10A and 10B compare the polishing rate of the colloidal silica abrasive and the present invention, wherein FIG. 10A compares the polishing rate for the case in which the polishing pressure is set to 0.56 $kg/cm^2$, while FIG. 10B compares the polishing rate for the case in which the polishing pressure is set to 0.21 $kg/cm^2$. In both of FIGS. 10A and 10B, the open circles represent the result for the conventional colloidal silica abrasive, while the solid circles represent the result for the slurry of the present invention that uses $MnO_2$ particles.

Referring to FIGS. 9A and 9B as well as FIGS. 10A and 10B, it will be noted that the slurry containing $MnO_2$ provides a larger polishing rate over the colloidal silica slurry, provided that the pressure of polishing is set the same and the rotational speed of the turntable as well as the revolving speed of the test piece are set the same. Particularly, it will be noted from FIG. 10B that the polishing rate increases generally linearly in the slurry containing $MnO_2$ with the increase of the turntable rotational speed when the polishing pressure is set to 0.21 $kg/cm^2$, while no substantial polishing occurs in this polishing pressure when the colloidal silica abrasive is used.

The results of FIGS. 9A, 9B, 10A and 10B indicate that the slurry using $MnO_2$ abrasive particles is effective not only to the polishing of conductor layers such as a W layer but is effective also to an insulation layer such as $SiO_2$.

While the reason that the $MnO_2$ particles can polish a $SiO_2$ layer having a larger Mohs hardness is not yet fully understood, it is probable that the oxygen atoms released from the $MnO_2$ particles, which act as a strong solid oxidant, cut the Si—O—Si network forming the $SiO_2$ layer. When this is correct, then the present invention should be effective also to other insulation layers containing Si—O—Si network such as PSG or BPSG.

Next, a fabrication process of a semiconductor device according to the present embodiment will be described with reference to FIGS. 11A–11I, wherein those parts described previously are designated by the same reference numerals and the description thereof will be omitted.

Referring to FIG. 11A, the MOS transistor is formed on a Si substrate 51 doped to the p-type in correspondence to an active region 51A defined by a field oxide film 51$a$. More specifically, the MOS transistor includes a diffusion region 51$b$ of the $n^+$-type formed on the surface of the active region 51A and another diffusion region 51$c$ also of the $n^+$-type formed on the surface of the active region 51A, wherein the diffusion region 51$b$ and the diffusion region 51$c$ are separated from each other by a channel region 51$d$ of the MOS transistor. On the substrate 51, there is provided a gate electrode 52 so as to cover the channel region 51$d$ with an intervening gate oxide film (not shown). Further, the gate electrode 52 carries side wall insulation films 52$a$ and 52$b$ on respective opposing side walls. It should be noted that the diffusion regions 51$b$ and 51$c$ act respectively as a source and a drain of the MOS transistor.

In the step of FIG. 11A, an interlayer insulation film 53 of $SiO_2$ is deposited so as to bury the MOS transistor, typically with a thickness of about 50 nm. As a result of deposition of the interlayer insulation film 53, the gate electrode 52 as well as the diffusion regions 51$b$ and 51$c$ are covered by the $SiO_2$ film 53. Thereby, the interlayer insulation film 53 shows a projection and a depression in conformity with the foregoing gate electrode 52.

Next, in the step of FIG. 11B, the structure of FIG. 11A is planarized by polishing the surface of the insulation film 53 uniformly by using a polishing apparatus such as the one shown in FIG. 4 and the slurry containing the $MnO_2$ abrasives dispersed in $H_2O$ acting as the solvents as described before. Further, in the step of FIG. 11C, the insulation film 53 is subjected to a photolithographic patterning process, in which a contact hole 53$a$ is formed in the interlayer insulation film 53 so as to expose the surface of the diffusion region 51$b$.

After the step of FIG. 11C, a TiN film 54$c$ is deposited upon the structure of FIG. 11C in the step of FIG. 11D as a diffusion barrier, such that the TiN film covers the upper major surface of the $SiO_2$ film 53 as well as the side wall of the contact hole 53$a$ and further the exposed bottom surface of the diffusion region 51$b$. After the TiN film 54$c$ is thus deposited, the conductor layer 54 is deposited thereon so as to fill the contact hole 53$a$ as indicated in FIG. 11D. Thereby, a depression 54$a$ is formed on the upper major surface of the conductor layer 54 in correspondence to the contact hole 53$a$. Further, a seam 54$e$ is formed in the conductor layer 54 in correspondence to the contact hole 53$a$ similarly to FIGS. 2A and 2B.

Next, the conductor layer 54 is polished in the step of FIG. 11E uniformly by using a slurry containing $MnO_2$ grains and $H_2O$ (pure water), and a structure shown in FIG. 11E is obtained, wherein the polishing stops spontaneously upon the exposure of the TiN film 54c that acts not only as a diffusion barrier but also as a polishing stopper. As a result of the planarization, achieved by the polishing process in cooperation with the polishing stopper layer 54c, the conductive plug 54b has an upper major surface coincident to the upper major surface of the TiN film 54c.

Next, in the step of FIG. 11F, an Al alloy (Al—Si—Cu alloy) layer is deposited on the TiN film 54c together with a thin intervening Ti film (not shown), as a conductor layer 55, and another TiN film 55a is sputtered upon the Al alloy layer 55 also with an intervening thin Ti film not illustrated.

In the step of FIG. 11G, the conductor layer 55 as well as the TiN films 54c and 55a sandwiching the layer 55 vertically are patterned by a photolithographic patterning process, to form a desired wiring pattern.

Further, in the step of FIG. 11H, an interlayer insulation film 56 typically of $SiO_2$, PSG or BPSG, is deposited on the structure of FIG. 11G by a CVD process such that the insulation film 56 covers the wiring pattern 55 as well as the TiN film 55a thereon.

Finally, in the step of FIG. 11I, the interlayer insulation film 56 is planarized by a polishing process, which is preferably conducted by using the slurry of the present invention containing $MnO_2$ particles, although a conventional colloidal silica slurry may be used also for this purpose.

Further, one may form any desired wiring pattern on the planarized surface of the insulation film 56.

As already noted, the present embodiment uses the slurry that contains $MnO_2$ as the abrasive particles in the polishing step of FIGS. 11B, 11E and 11I. In these polishing steps, the $MnO_2$ particles are typically dispersed in $H_2O$ with a concentration of 7% by weight, and the polishing is made on a urethane cloth (IC1000) provided on the turntable 101 of FIG. 4, which turntable 101, in turn, is covered by an unwoven fabric cloth (SUBA400), wherein the polishing is made with a pressure of typically 2 kg/cm² while rotating the turntable 101 at a rotational speed of 100 rpm and simultaneously the test piece held by the holder 104 in the same direction at the same rotational speed.

By using the same slurry in the polishing steps of FIG. 11B, 11E and 11I, one can use the same polishing apparatus or facility and the fabrication cost of the semiconductor device is reduced substantially. Further, the sludge processing is substantially simplified.

Figure 12:
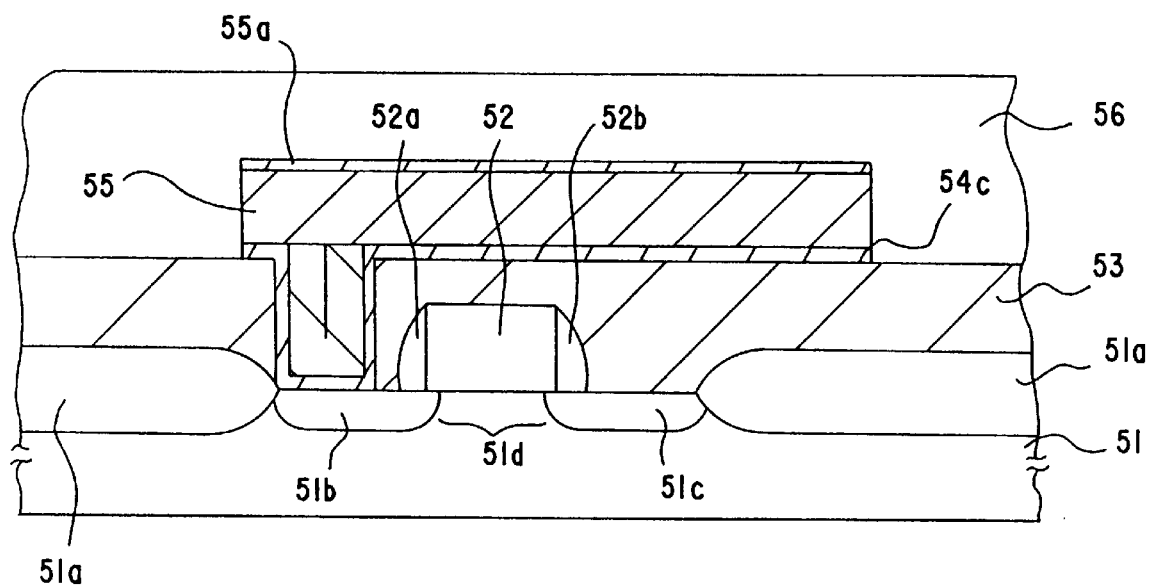
FIG. 12 is a diagram showing the polishing of a stepped structure according to the third embodiment of the present invention.
Figure 12:
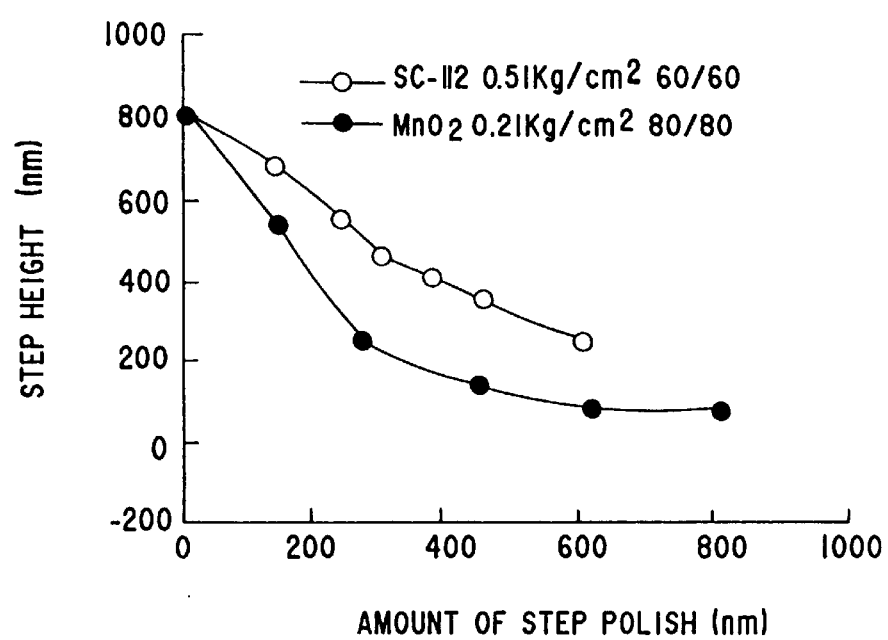

FIG. 12 shows the relationship between the step height and the amount of polishing for a test structure in which a step height of 800 nm is formed on a $SiO_2$ film deposited on a Si substrate by a CVD process.

Referring to FIG. 12, the curve designated by the open circles represents the case in which a conventional colloidal silica slurry (SC112) is used with the polishing pressure of 0.51 kg/cm² while rotating the turntable 101 and the head 104 represented in FIG. 4 in the same direction with the same rotational speed of 60 rpm. On the other hand, the curve designated by solid circles represents the case in which the slurry of the present invention containing $MnO_2$ particles dispersed in the $H_2O$ solvent is used for the polishing. In this case, the polishing was made with the pressure of 0.21 kg/cm$^{-2}$ while rotating the turntable 101 and the head 104 of FIG. 4 in the same direction with the rotational speed of 80 rpm. In the present experiment, it should be noted that the polishing pressure for the colloidal silica slurry is set substantially higher than that of the $MnO_2$ slurry in view of the relatively high polishing pressure required for the colloidal silica slurry, such that both slurries show substantially the same polishing rate when applied to a flat surface of a $SiO_2$ film.

The result of FIG. 12 clearly indicates that the stepped part of the $SiO_2$ film is polished away more efficiently when the slurry of the present invention is used as compared with the case in which a conventional colloidal silica abrasive is used. In other words, the slurry of the present invention in which $MnO_2$ abrasive particles are dispersed in a $H_2O$ solvent is extremely effective for planarizing an insulation layer such as a $SiO_2$ film.

In each of the polishing steps of FIGS. 11B, 11E and 11I, the semiconductor structure is cleaned in a cleaning solution, which may be a mixture of $H_2O_2$ and an acid such as HCl, $H_2SO_4$ or $HNO_3$, such that the remaining $MnO_2$ particles are dissolved.

FIGS. 13A–13D show a modification of the present embodiment for forming a shallow trench isolation structure on a Si substrate.

Figure 13A:
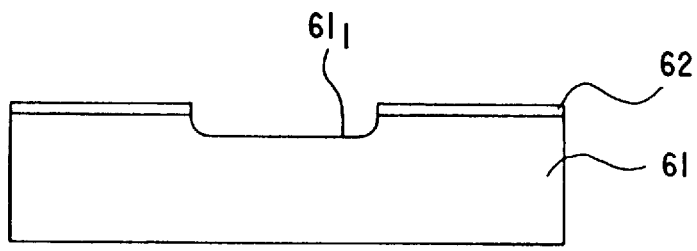
FIGS. 13A–13D are diagrams showing another fabrication process of a semiconductor device according to the third embodiment of the present invention.

Referring to FIG. 13A, a Si substrate 61 is covered by a TiN film 62 with a thickness of 0.05 $\mu$m, wherein the TiN film 62 thus provided as well as the Si substrate 61 underneath are patterned subsequently to form a shallow trench 61₁ having a depth of about 0.3 $\mu$m.

Figure 13B:
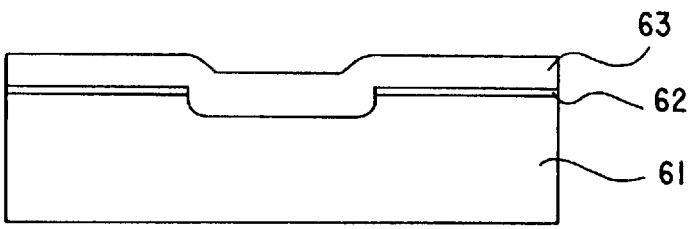

Next, in the step of FIG. 13B, a $SiO_2$ film 63 is deposited by a plasma deposition process with a thickness of 0.5 $\mu$m so as to fill the shallow trench 61₁.

Figure 13C:
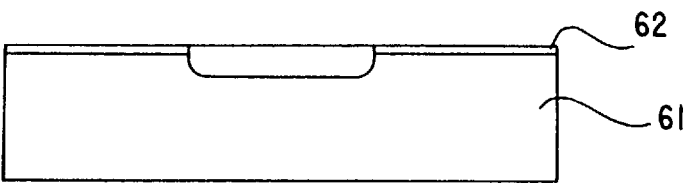

Further, in the step of FIG. 13C, the $SiO_2$ film 63 is subjected to a polishing process by using the slurry of the present invention in which $MnO_2$ particles are dispersed in a $H_2O$ solvent. Thereby, the $MnO_2$ particles remove the $SiO_2$ film efficiently until the TiN film 62 acting as a polishing stopper is exposed.

Figure 13D:
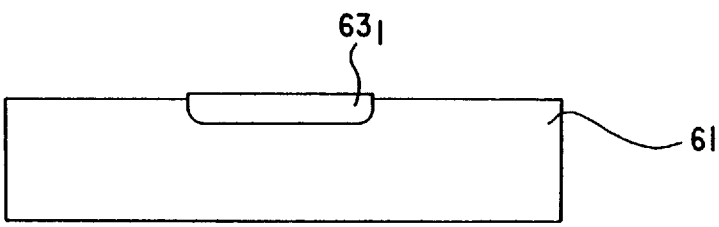

Finally, in the step of FIG. 13D, the TiN film 62 is removed by a suitable process such as etching or polishing.

According to the process of FIGS. 13A–13D, it is possible to form an isolation trench 61₁ filled by a device isolation oxide layer 63₁ in a Si substrate, with an excellent surface planarization.

As already noted, the present embodiment for polishing an insulation layer by the slurry of the present invention is not limited to a $SiO_2$ film but is applicable also to the polishing of other insulation films including therein a network of Si—O—Si. Further, one may polish such an insulation material other than $SiO_2$ such as PSG, BPSG or SOG.

Further, the present invention is not limited to the embodiments described heretofore, but various variations and modifications may be made without departing from the scope of the invention.

What is claimed is:

1. A slurry, comprising:

abrasive particles of $MnO_2$;

a solvent in which said abrasive particles are dispersed; and an additive containing a benzene ring, added to said solvent.

2. A slurry as claimed in claim 1, wherein said solvent is $H_2O$, and wherein said additive comprises a phthalic compound.

3. A slurry as claimed in claim 1, wherein said solvent is $H_2O$, and wherein said additive comprises an anthranilate and an anthranilic acid.

4. A slurry as claimed in claim 1, wherein said solvent is selected from $H_2O$ and a lower alcohol, and wherein said additive is selected from a phthalic acid and a benzoic acid.

5. A slurry, comprising:

abrasive particles of $MnO_2$;

a solvent of $H_2O$ in which said abrasive particles are dispersed; and an additive added to said solvent;

said additive being selected from a lactic acid and lactose.

* * * * *